US006532571B1

(12) United States Patent
Gabrielson et al.

(10) Patent No.: US 6,532,571 B1
(45) Date of Patent: Mar. 11, 2003

(54) METHOD TO IMPROVE A TESTABILITY ANALYSIS OF A HIERARCHICAL DESIGN

(75) Inventors: Richard M. Gabrielson, Vestal, NY (US); Kevin W. McCauley, Greene, NY (US); Richard F. Rizzolo, Red Hook, NY (US); Bryan J. Robbins, Poughkeepsie, NY (US); Joseph M. Swenton, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/489,240

(22) Filed: Jan. 21, 2000

(51) Int. Cl.[7] ........................... G06F 17/50; G01R 31/28
(52) U.S. Cl. ........................... 716/4; 714/729; 714/738; 714/733; 714/726
(58) Field of Search .............................................. 716/4

(56) References Cited

U.S. PATENT DOCUMENTS

| 3,761,695 A | | 9/1973 | Eichelberger | 235/153 AC |
|---|---|---|---|---|
| 4,687,988 A | * | 8/1987 | Eichelberger et al. | 324/73.1 |
| 4,715,034 A | * | 12/1987 | Jacobson | 365/201 |
| 5,748,497 A | * | 5/1998 | Scott et al. | 702/123 |
| 5,825,785 A | * | 10/1998 | Barry et al. | 714/726 |
| 5,983,380 A | * | 11/1999 | Motika et al. | 714/30 |
| 6,059,451 A | * | 5/2000 | Scott et al. | 714/726 |
| 6,314,540 B1 | * | 11/2001 | Huott et al. | 714/738 |
| 6,363,520 B1 | * | 3/2002 | Boubezari et al. | 716/18 |
| 6,415,403 B1 | * | 7/2002 | Huang et al. | 714/726 |
| 6,442,720 B1 | * | 8/2002 | Koprowski et al. | 714/726 |
| 2002/0040458 A1 | * | 4/2002 | Dervisoglu et al. | 714/729 |

OTHER PUBLICATIONS

R. Tupuri et al, "Hierarchical Test Generation for System on a Chip", 13th International Conference on VLSI Desiogn Jan. 3–7, 2000, pp 198–203.*

C.P. Ravikumar et al, "HISCOAP: A Hierarchical Testability Analysis Tool", 8th International Conference on VLSI Desihn—Jan. 1195—pp 272–277.*

P.H. Bardell and W.H. McAnney, "Self–Testing of Multichip Modules," Proceedings of the IEEE International Test Conference, 1982, pp. 200–204.

Sunil K. Jain and Vishwani D. Agrawal (AT&T Bell Laboratories), "Statistical Fault Analysis," IEEE Design & Test of Computers, vol. 2 No. 2, Fed 1985, pp. 38–44.

S.K. Jain and Vishwani D. Agrawal, "STAFAN: an Alternative to Fault Simulation," ACM/IEEE 21st Design Automation Conference Proceedings, Jun. 1984, pp. 18–23.

E.B. Eichelberger and T.W. Williams, "A Logic Design Structure for LSI Testability," Proceedings of the 14th Design Automation Conference, New Orleans, 1977, pp. 462–468.

* cited by examiner

Primary Examiner—Vuthe Siek
Assistant Examiner—Magid Y Dimyan
(74) Attorney, Agent, or Firm—Lynn L. Augspurger; Harness, Dickey & Pierce, P.L.C.

(57) ABSTRACT

A method to improve the testability and analysis of a hierarchical semiconductor chip design formed from a plurality of macros, each macro identifying a particular portion of a semiconductor chip design. This method includes providing a first macro netlist that identifies a logical description of a first portion of the semiconductor chip design and performing RPT analysis on the first macro netlist. The method also includes providing a second macro netlist identifying a logical description of a second portion of the semiconductor chip design and performing an RPT analysis on the second macro netlist. The first macro netlist is combined with the second macro netlist and an RPT analysis is performed on the combination of the first and second macro netlists.

14 Claims, 12 Drawing Sheets prior art RPT process

RPT PROCESS FOR HIERARCHICAL DESIGN

IMPROVED RPT PROCESS

IMPROVED RPT PROCESS (CONT.)

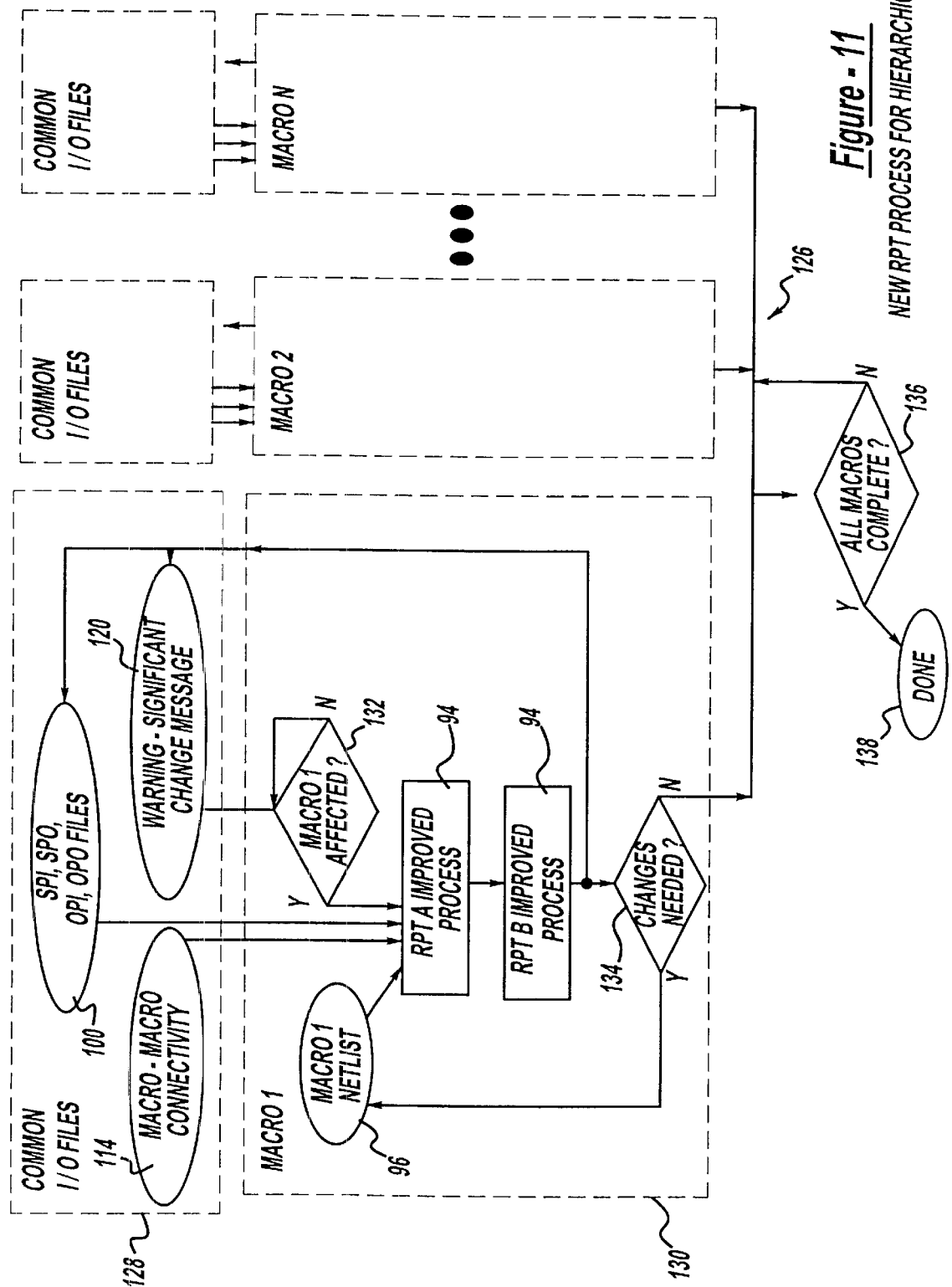
*Figure - 11* NEW RPT PROCESS FOR HIERARCHICAL DESIGN

METHOD TO IMPROVE A TESTABILITY ANALYSIS OF A HIERARCHICAL DESIGN

BACKGROUND OF THE INVENTION

1. Field of the Invention

This invention relates generally to digital logic design and testability of semiconductor chips and, more particularly, to a method to improve random pattern testability (RPT) analysis of a hierarchical design of a semiconductor chip.

2. Discussion of the Related Art

Random pattern testability of semiconductor chips has become increasingly important due to the emphasis on chip built-in self-test methods (BIST). BIST is a way of testing chip logic without the use of an external tester as disclosed in P. H. Bardell and W. H. McAnney, "Self-Testing of Multichip Modules," Proceedings of the IEEE International Test Conference, 1982, pp. 200–204, which is hereby incorporated by reference. Once a chip is manufactured, it is subjected to electronic testing to verify that it works properly. BIST is increasingly an important part of this testing since less complex testers are required and perhaps no tester is required. After the semiconductor chip is assembled in a more complex system (a multi-chip circuit board, for example), BIST is often automatically run whenever the chip is first turned on. It may also be run during diagnostic or trouble-shooting routines. In many cases, BIST is the only test that may be run on a chip once it is installed in a more complex system like a multi-chip circuit board. The quality of the circuit board test is, therefore, heavily dependent on the quality of the BIST test, since there may be many semiconductor chips on the circuit board itself, each testable only by BIST at the assembly level.

Most BIST techniques use a pseudo-random pattern generator (PRPG) to generate test patterns. The PRPG is an internal logic circuit in the semiconductor chip itself that generates a random, but repeatable set of 1s and 0s that are applied to chip inputs and latches. E. B. Eichelberger, E. Lindbloom, J. A. Waicukauski, T. W. Williams, "Structured Logic Testing", pp. 90–103, Prentice Hall, 1991. An exemplary way of applying PRPG data to latches is through a scan chain. E. B. Eichelberger and T. W. Williams, "A Logic Design Structure For LSI Testability," Proceedings of the 14th Design Automation Conference, New Orleans, 1977, pp. 462–468 describes such a scan technique, which is hereby incorporated by reference. In its most common implementation, the probability of a 1 at a latch or input equals the probability of a 0 =0.5 (i.e., P(0)=P(1)=0.5).

In general, it is not possible to test all logic on a semiconductor chip using BIST. One of the most common reasons for this is that certain logic structures are generally random pattern resistant. For example, the 32-input AND circuit 10, shown in FIG. 1, is random pattern resistant. The 32-input AND circuit 10 includes a first 16-input AND circuit 12 and a second 16-input AND circuit 14 each fed to a separate AND gate 16. Each AND circuit 12 and 14 also include a plurality of individual AND gates 18. All AND inputs 20 are assumed to be controllable (fed directly by latches), and the output 22 of AND gate 16 is assumed to be the only observable point (directly feeds a latch). In order to test for single stuck-at faults on any one of the blocks in the first level, the 32-inputs 20 have to be specified with 31-inputs 20 at "1" to propagate a potential fault to the observable point or output 22. In other words, should 31 inputs 20 be forced to a "1" and one input 20 be forced to a "0" if the circuit 10 is operating correctly, a "0" should be observed at the output 22. If the circuit 10 is not operating properly, a fault or a "1" would be observed at the output 22.

The probability of 31-inputs 20 being a "1" and one of the inputs 20 being a "0" randomly occurring in any single pattern is $\frac{1}{2^{32}}$. This probability is basically 0 for any practical test time. Methods exist that analyze logic for random pattern testability (RPT) and suggest test points that can improve the RPT. These methods are discussed in Sunil K. Jain and Vishwani D. Agrawal (AT & T Bell Laboratories), "Statistical Fault Analysis," IEEE Design and Test of Computers, Vol 2, No. 2, February 1985, pp. 38–44; S. K. Jain and Vishwani D. Agrawal, "STAFAN: An Alternative To Fault Simulation," ACM/IEEE 21st Design Automation Conference Proceedings, June 1984, pp. 18–23; and U.S. Pat. No. 3,761,695, each of which are hereby incorporated by reference.

A more testable version of the 32-input AND circuit 10', is shown in FIG. 2. In this regard, like reference numerals will be used to identify like structures with respect to the 32-input AND circuit 10, shown in FIG. 1. As shown in FIG. 2, four test points 24, using observation latches 26 (i.e., two in each 16-input AND circuits 12 and 14) have been added to the design. Each observation latch 26 is based upon level sensitive scan design (LSSD) and includes a pair of master-slave latches which enables and provides observable and controllable points 24. LSSD is further disclosed in detail in E. B. Eichelberger and T. W. Williams, "A Logic Design Structure for LSI Testability," Proceedings of the 14th Design Automation Conference, New Orleans, 1977, pp. 462–468, which is hereby incorporated by reference.

In order to test the test points 24, now only 8-inputs 20 must be specified. The one under test (i.e., "0") and the next 7-inputs 20 set to a "1". The probability of this result randomly occurring in any single pattern is $\frac{1}{2^{8}}$. This is only $\frac{1}{256}$. Since generally tens of thousands of patterns are applied, this is now easily testable. In fact, with this configuration, all but three AND gates are testable. In this regard, the last AND gates 18 in circuits 12 and 14 and the AND gate 16 are not testable. Therefore, the circuits in these last two stages may still have some faults (input stuck at 0, for example), which are not testable as shown in FIG. 2.

In order to test these last two stages, additional test points, generally known as control test points, must be added to the circuit 10'. These additional test points are shown in FIG. 3. Here again, like reference numerals will be used to identify like structures with respect to the circuit 10". As shown in FIG. 3, two control latches 28 are added to each circuit 12 and 14 which again comprise a pair of master and slave latches. A pair of two way OR gates 30 are also added to each circuit 12 and 14. The addition of the control latches 28 and the OR gates 30 enables an alternate way to set an input/output to a "1" state. In this regard, in order to test the final AND gate 16 for a stuck-at-0 fault on either input, both inputs must be set to a "1".

In the 32-way AND circuits 10 and 10', shown in FIGS. 1 and 2, the 32-inputs 20 have to be set to "1". This is not possible with random patterns. In the 32-way AND circuit 10" of FIG. 3, the states of only four control latches 28 need to be specified, which is easily tested with random patterns. In other words, upon setting the control latches 28 to a "1" state, each two-way OR 30 will be forced to have a "1" output, thereby causing the last AND gates 18 in circuits 12 and 14 to provide "1" inputs to the AND gate 16 to confirm the operation of the entire circuit 10". This modified 32-input AND circuit 10" is one hundred percent (100%) random pattern testable based upon the addition of the observation latches 26, the control latches 28 and the OR gates 30. However, one disadvantage with this circuit 10" is that the OR gates 30 are placed in-line with each circuit 12 and 14, thus causing these circuits 12 and 14 to run slower than if the OR gates 30 were not present.

A flow chart illustrating a typical prior art random pattern testability analysis or process 32 is shown in FIG. 4. The RPT analysis 32 receives an input from a design netlist input block 34. The design netlist block 34 identifies the circuit or entity being analyzed and is assumed to have all netlist inputs directly controllable and all netlist outputs directly observable. The design netlist block 34 provides a logical description of the design of the chip by mapping all of the inter-connections throughout the chip. The other input to the RPT analysis 32 is a maximum pattern count block 36. The maximum pattern count block 36 identifies the number of random patterns to run in the RPT analysis 32 which can range from several thousand to several million random patterns. The number of random patterns used is generally only governed by the test time and the test cost. The more random patterns run, the higher the test time and the higher the test cost. The input blocks 34 and 36 are directed to a random pattern simulation block 38. The random pattern simulation block 38 assumes fixed probabilities for all inputs P(0). In this regard, the input probability of a "1" or a "0" at each input is generally set to 0.5. However, this probability input may be adjusted to be, for example, thirty percent (30%) for a "1" and seventy percent (70%) for a "0", or any other appropriate values.

From the random pattern simulation block 38, the RPT analysis 32 progresses to the RPT algorithm block 40. The RPT algorithm 40 is a known prior art algorithm and is further disclosed in detail in references to Sunil K. Jain and Vishwani D. Agrawal (AT & T Bell Laboratories), "Statistical Fault Analysis", IEEE Design & Test of Computers, Vol 2 No. 2, February 1985, pp. 38–44; S. K. Jain and Vishwani D. Agrawal, "STAFAN: an Alternative to Fault Simulation," ACM/IEEE 21st Design Automation Conference Proceedings, June 1984, pp.18–23; and U.S. Pat. No. 3,761, 695, which are each hereby incorporated by reference. The output from the RPT algorithm 40 is an RPT percent coverage block 42, an identification of test points to improve RPT block 44 and a signal probabilities block 46. The RPT percent coverage block 42 identifies the percent of the circuit or chip that is random pattern testable. The test points block 44 are identified as control and observation points and are suggested conditions to the logic circuit to improve the RPT percent coverage 42. In other words, the test points block 44 identifies the additional observation latches, control latches, OR gates, etc. that may be added to the circuit, such as that shown in FIGS. 1–3 to improve the RPT percent coverage 44. The logic designer may or may not add these particular circuits to the logic depending on how close the design is to the testability target, scheduling, available circuit area, etc. The signal probabilities block 46 identifies the signal probabilities for each input and output of each gate or logic in the circuit tested. This information is generally provided but not used in the design or test process.

The above RPT analysis 32 works well for small chips where all logic or gates elements are analyzed at once. However, chips are rapidly becoming larger, with tens of millions of transistors becoming commonplace. Because of this, logic design is now generally performed in a hierarchical fashion. Smaller logical partitions of a chip, referred to as "macros" are designed first, and they are stitched together later. One semiconductor chip may have dozens to hundreds of macros. RPT analysis 32 cannot practically be done on an entire semiconductor chip for several reasons. These reasons include that the full chip model is too large, the simulation run times are very long, the full chip model is not ready until late in the design cycle which is generally too late to make any changes, and errors or problems in a single macro can cause the entire simulation to run to abort.

What is needed then is a method to improve random pattern testability analysis of a hierarchical design which does not suffer from these disadvantages. This will, in turn, provide a more robust testing method that enables testing earlier in the design sequence, enables changing of the logic circuitry earlier in the design sequence, enables testing of substantially large semiconductor chips and provides a more reliable RPT analysis. It is, therefore, an object of the present invention to provide such a method to improve random pattern testability analysis of a hierarchical design.

SUMMARY OF THE INVENTION

This invention is a technique to more accurately evaluate random pattern testability (RPT) of a hierarchical chip design. Use of this technique will improve the accuracy of RPT at lower levels of the hierarchy (such as logic macros) prior to combining them together into a complete chip. The resultant macro testability reports and test point insertion information will be more accurate. More effective RPT fixes will be done at macro level. As a result, there will be fewer random pattern testability problems visible once the entire chip is assembled from the lower hierarchy levels and simulated. Fewer iterations at a chip level will be required to meet RPT targets.

Iterations at a macro level use much less space (memory) and time (CPU) than iterations at a chip level by a factor of 10 to 100 or more. Macros are designed much sooner than the full chip model. There is more time for logic and circuit layout changes to fix test problems. Macro simulation models are much less prone to unexpected problems compared to the full chip model. A problem with one macro (out of hundreds) can cause a problem with the chip model and finally, this new method does not require the design to be complete. As each macro in the design is done, the RPT calculations become more accurate.

In one preferred embodiment, a method to improve random pattern testability (RPT) of a hierarchical semiconductor chip design formed from a plurality of macros, with each macro identifying a particular portion of the semiconductor chip design is provided. This method includes providing a first macro netlist that identifies a logical description of a first portion of the semiconductor chip design and performing RPT analysis on the first macro netlist. The method also includes providing a second macro netlist identifying the logical description of a second portion of a semiconductor chip design and performing RPT analysis on the second macro netlist. The first macro netlist and the second macro netlist are combined and RPT analysis is performed on the combination of the first and second macro netlists.

Use of the present invention provides a method to improve random pattern testability analysis of a hierarchical semiconductor chip design. As a result, the aforementioned disadvantages associated with the current testing procedures for semiconductor chips have been substantially reduced or eliminated.

BRIEF DESCRIPTION OF THE DRAWINGS

Still other advantages of the present invention will become apparent to those skilled in the art after reading the following specification and by reference to the drawings in which:

FIG. 11 is a flow chart describing the RPT process for a hierarchical design according to the teachings of a third preferred embodiment of the present invention.

DETAILED DESCRIPTION OF THE PREFERRED EMBODIMENT(S)

The following description of the preferred embodiments concerning a method to improve random pattern testability analysis of a hierarchical chip design are merely exemplary in nature and are not intended to limit the invention or its application or uses. Moreover, while the present invention is described in detail below with reference to particular circuit configurations, it will be appreciated by those skilled in the art that the present invention is clearly not limited to these types of circuit configurations which are merely used for exemplary purposes.

Figure 1:
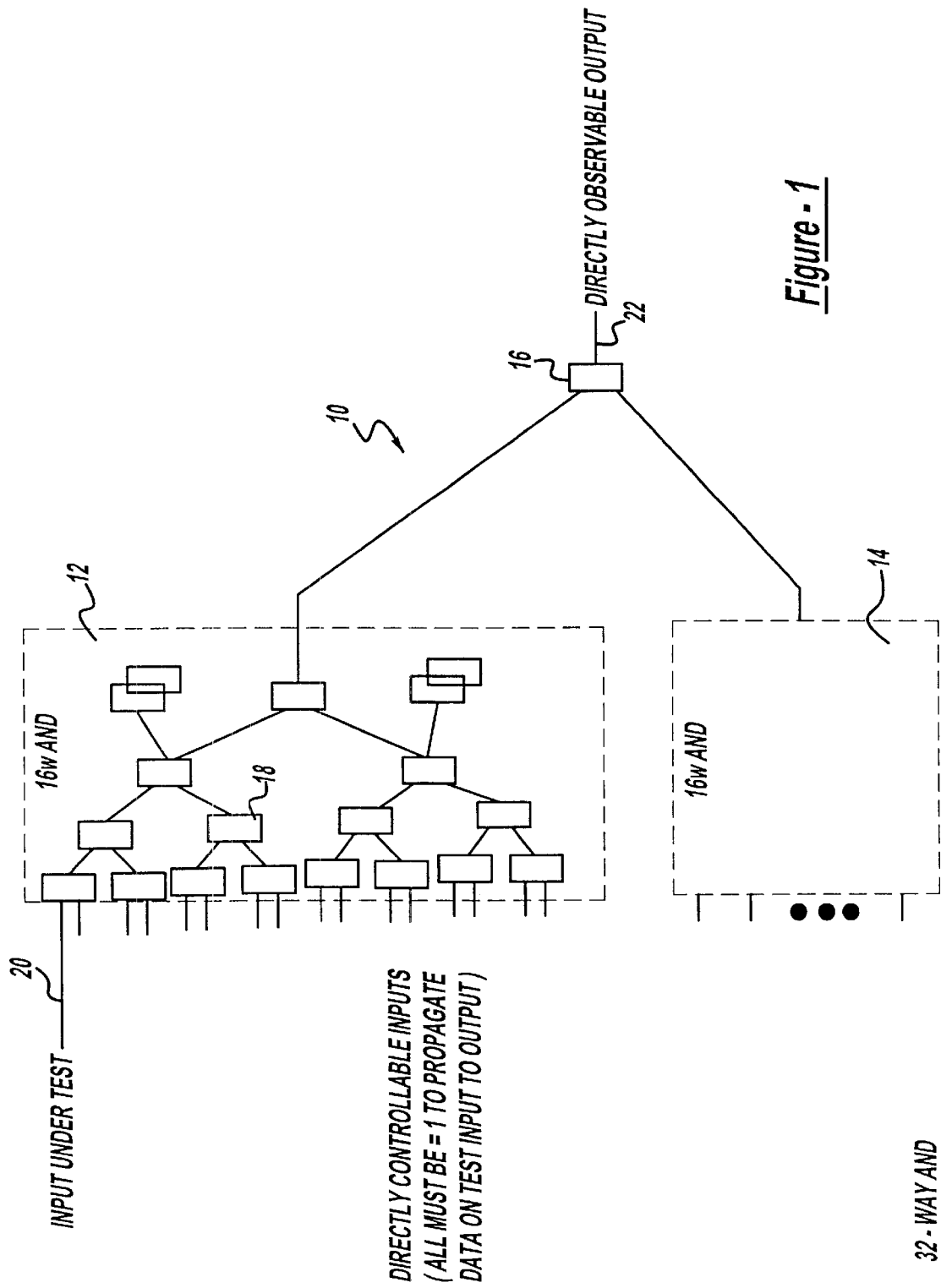
FIG. 1 illustrates a 32-input AND circuit which is not random pattern testable.
Figure 5:
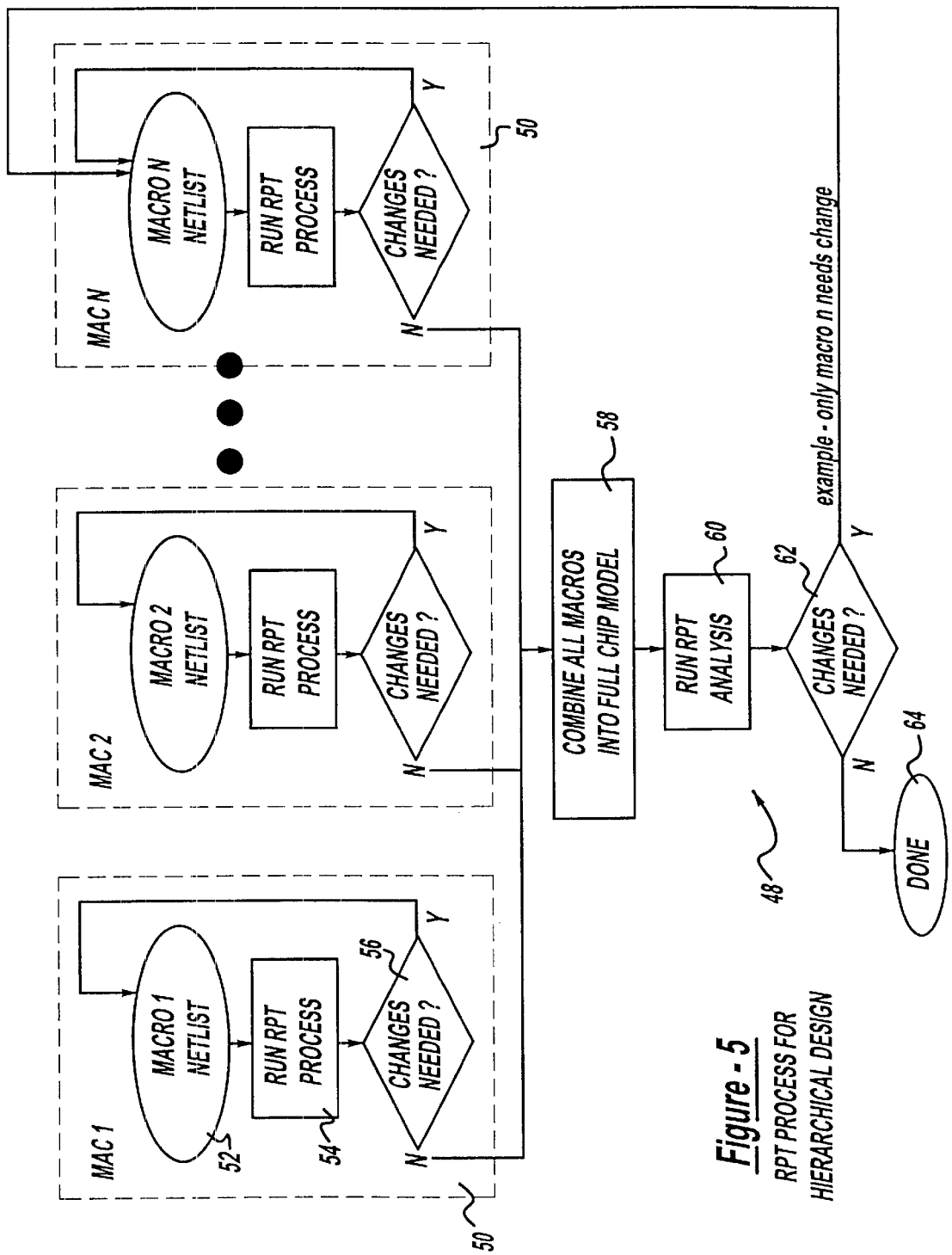
FIG. 5 illustrates an RPT analysis for a large hierarchical chip design according to the teachings of a first preferred embodiment of the present invention.

A random pattern testability analysis or process for hierarchical design 48 according to the teachings of a first preferred embodiment of the present invention is shown in FIG. 5. The RPT analysis 48 expands to N number of individual and independent RPT analyses 50. In this regard, the RPT analysis for hierarchical design 48 performs individual and independent RPT analysis 50 on each individual circuit or macro, such as circuit 10 shown in FIGS. 1–3 as opposed to the entire semiconductor chip having many macros. In this way, a typical semiconductor chip is designed on a circuit-to-circuit level with each circuit or macro then being combined with other circuits or macros to form the entire semiconductor chip. This RPT analysis 48 tracks this similar design strategy by enabling independent RPT analysis 50 to be performed as each macro design is completed, enabling earlier RPT results in the design process.

Figure 4:
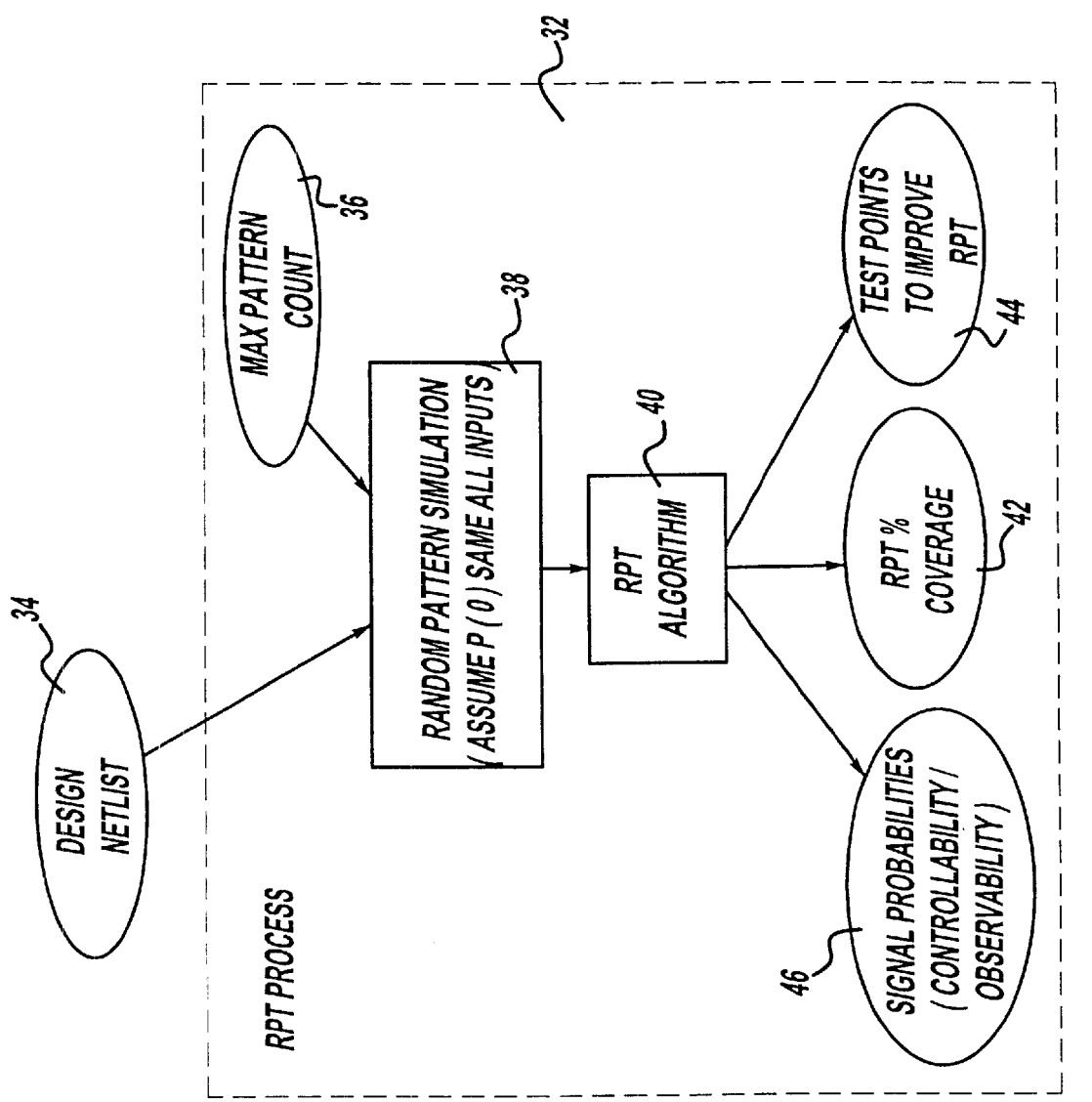
FIG. 4 is a flowchart describing a prior art random pattern testability (RPT) analysis.

Each individual RPT analysis 50 includes a macro netlist input block 52 identifying the particular macro design, an RPT analysis block or process 54 and a changes needed decision block 56. The macro netlist block 52 identifies the logic design of the particular circuit or macro being tested. The run RPT analysis block 54 essentially-performs a typical RPT analysis, similar to the RPT analysis 32, shown in FIG. 4. The changes needed decision block 56 analyzes the output of the RPT analysis 54 which includes the RPT percent coverage 42 and the test points 44 and determines whether changes are needed to improve the RPT percent coverage 42. Should changes be needed, these changes are made to the macro netlist input block 52 and the RPT analysis 54 is again run on the new macro netlist 52. Once the RPT percent coverage 42 is acceptable and no changes are needed from decision block 56, that particular independent RPT analysis 50 is completed on that macro netlist 52. By performing individual and independent RPT analysis 50 on each separate macro netlist 52, as each macro is designed in a parallel fashion, this enables design updates to be performed at individual macro levels earlier in the design sequence.

Once all of the individual RPT analysis 50 have been performed on each macro in the entire semiconductor chip, all of the completed macro netlists 52 are combined into a full netlist chip model in block 58. From block 58, an RPT analysis is again performed at block 60 on the entire netlist for the entire semiconductor chip with all the updated macro netlist 52 designs. The RPT percent coverage 42 and test points to improve RPT 44 are again reviewed in the changes needed decision block 62 to determine whether any further design changes need to be made to any particular macro netlists 52. Should design changes be needed, that particular macro netlist 52 may be modified and the entire system retested again. Should no changes be needed, the RPT analysis for the hierarchical design 48 ends at the done block 64.

While the RPT analysis 48 improves upon the prior art RPT analysis 32 by looking at each individual circuit or macro individually and running independent parallel testing as each macro design is completed, there are inherent problems with the RPT analysis 48, as well. In this regard, since inputs and outputs from various macros can effect other macros, design changes, such as test point insertion to improve macro level testability may not improve testability for the entire semiconductor circuit at all, thereby wasting this design effort. Moreover, macros or circuits that appear to be testable at macro level may not be testable at chip level. This is because one of the basic assumptions when individual RPT analysis 50 is performed on a macro netlist 52 is that all inputs are directly controllable and all outputs are directly observable is not, in general, true when all the macro netlists 52 are connected to one another in the entire chip format at block 58.

Figure 6:
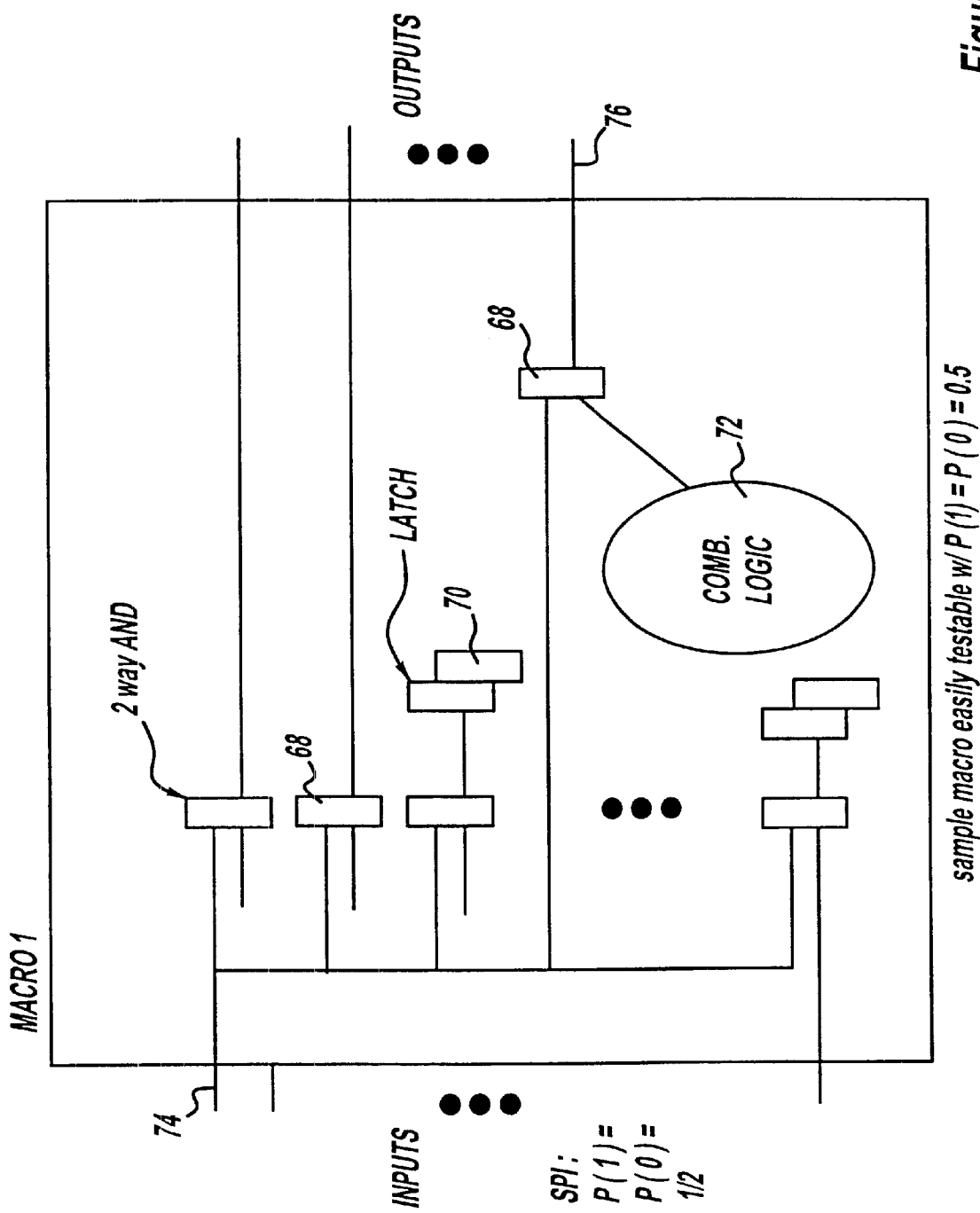
FIG. 6 provides an example of a macro that appears testable when RPT is run at a macro level.

These inherent problems are illustrated by way of FIGS. 6–9. In FIG. 6, macro 1, identified by reference numeral 66, includes multiple AND gates 68, master and slave latches 70, and combinational logic circuitry 72 which consists of AND and OR gates with no storage devices (i.e., no latches). The macro 1 is fed by a plurality of inputs 74 and includes a plurality of outputs 76. The first input 74 also has a high fan out in that it effects the operation of many individual gates, latches or logic in the macro 1. When macro 1 is analyzed for RPT using the individual RPT analysis 50, a fixed input signal probability is assumed. In this regard, the probability of an input 74 being high, P(1), or being low, P(0), may equal 0.5 for example and is the same for all inputs 74 with the understanding that all inputs 74 are assumed to be directed controllable and all outputs 76 are assumed to be directly observable. After RPT analysis 50 is performed on macro 1, RPT percent coverage 42 and test points to improve RPT 44 are generated. In this case, macro 1 is assumed to be easily testable given the input assumptions. However, once all the macros or the macro netlists 52 in the entire semiconductor chip are combined into a full chip model in block 58, many inputs are not directly controllable and many outputs are not directly observable. Actual signal probability P(1) or P(0) for each input 74 is thus different, and some input signal probabilities may be nearly "1" or nearly "0".

Figure 7:
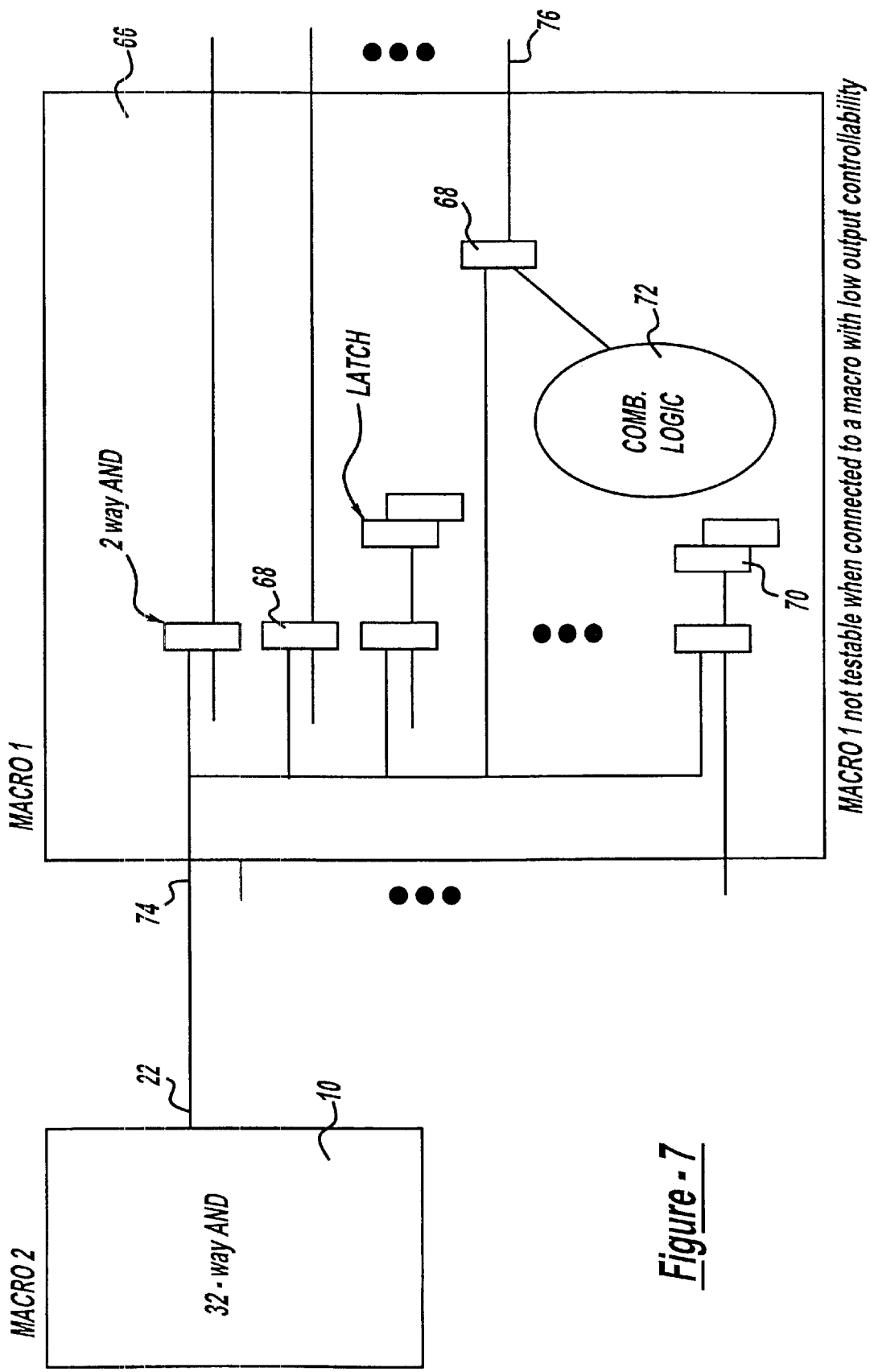
FIG. 7 provides an example of a macro that had high RPT based on macro level analysis, but low RPT at full chip level.

An example of this problem is shown in FIG. 7. In FIG. 7, macro 1, identified by reference numeral 66, is now combined with macro 2 which is the 32-way AND circuit 10, shown in FIG. 1. Because the output 22 of the 32-way AND circuit 10 is "0" for all practical random pattern test sizes, a large portion of the logic in macro 1 is not random pattern testable. This is because input 74, connected to output 22, fans out to many AND circuits 68 in macro 1. In other words, each AND gate 68 in macro 1 is not testable since you need a "1" at each input to the AND gates 68 which generally will not result at the output 22 of the 32-way AND circuit 10 of macro 2. In addition, all logic proceeding each AND circuit 68 may not be testable. Alternatively, if macro 2 is the 32-way AND circuit 10' of FIG. 2, it is highly RP testable. Therefore, both macro 1 and macro 2 look very RP testable at the individual macro level, such as observed by the individual RPT analysis 50. However, when they are combined as a full chip model in block 58, one can observe that macro 1 is highly untestable due to the essentially zero probability of input 74 at a "1" of macro 2.

Figure 8:
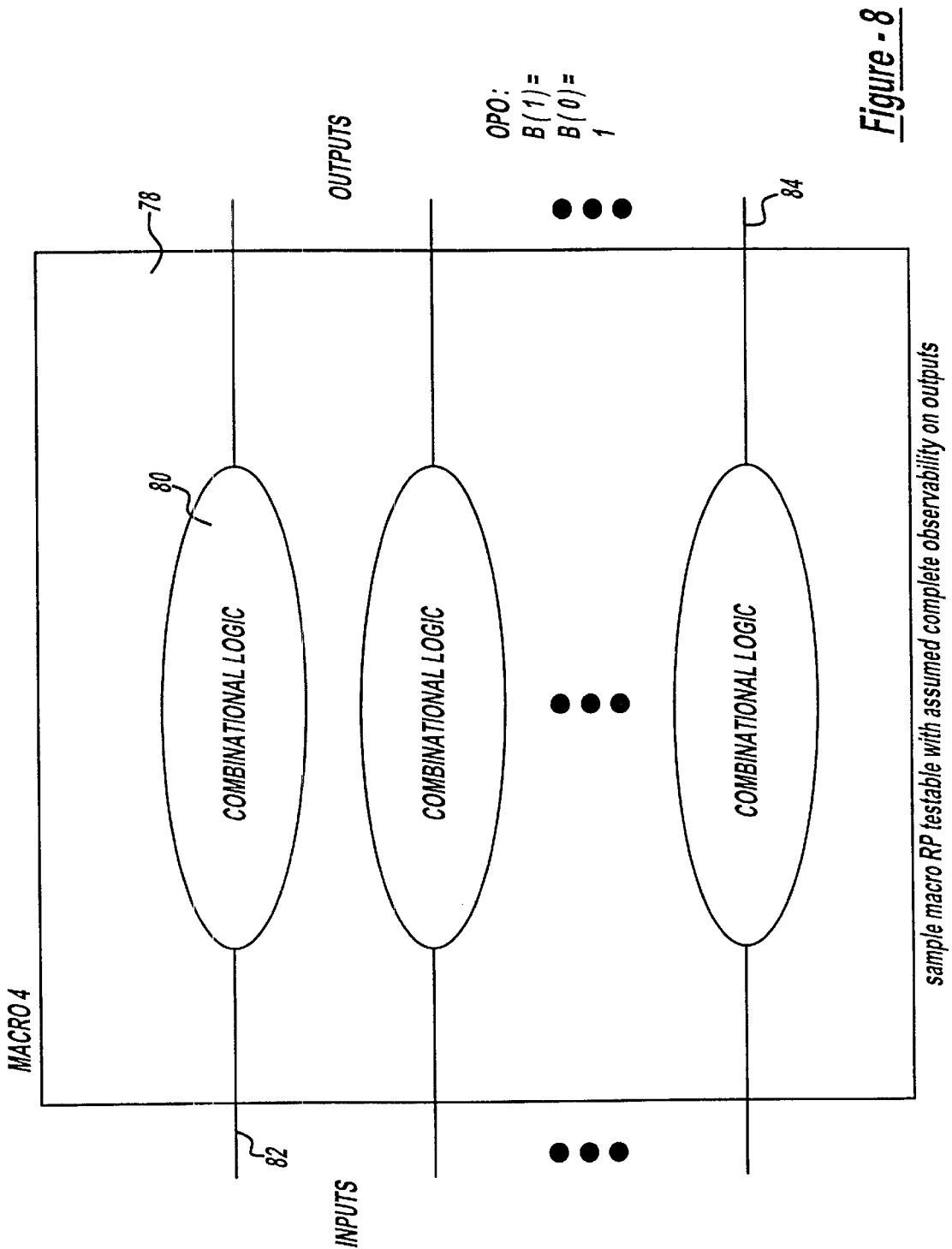
FIG. 8 provides an example of a macro that appears to have complete observability on its outputs at a macro level.

Referring to FIG. 8, macro 4, identified by reference numeral 78, includes multiple combinational logic circuits 80 throughout the macro 4. The combinational logic circuits 80 consist of combinations of AND and/or OR gates with no storage devices. Macro 4 further includes a plurality of inputs 82 and a plurality of outputs 84. Again, making the assumption of completely controllable inputs 82 and complete observability on the outputs 84, macro 4 is one hundred percent (100%) RPT testable when run through an individual RPT analysis 50. However, this result changes when macro 4 is coupled to macro 3, identified by reference numeral 86, in FIG. 9.

Figure 2:
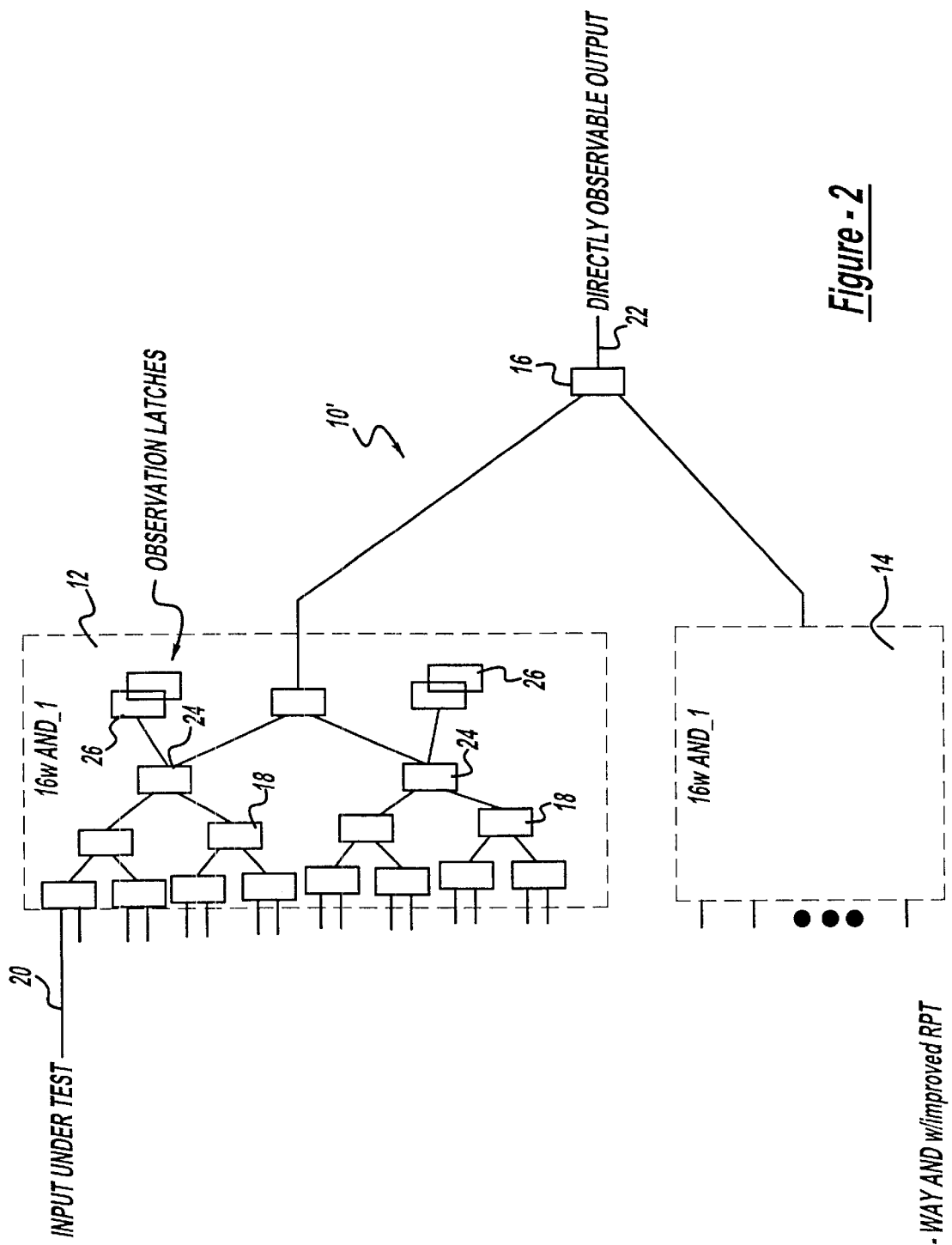
FIG. 2 illustrates a 32-input AND circuit with observation test points added which is highly random pattern testable.
Figure 3:
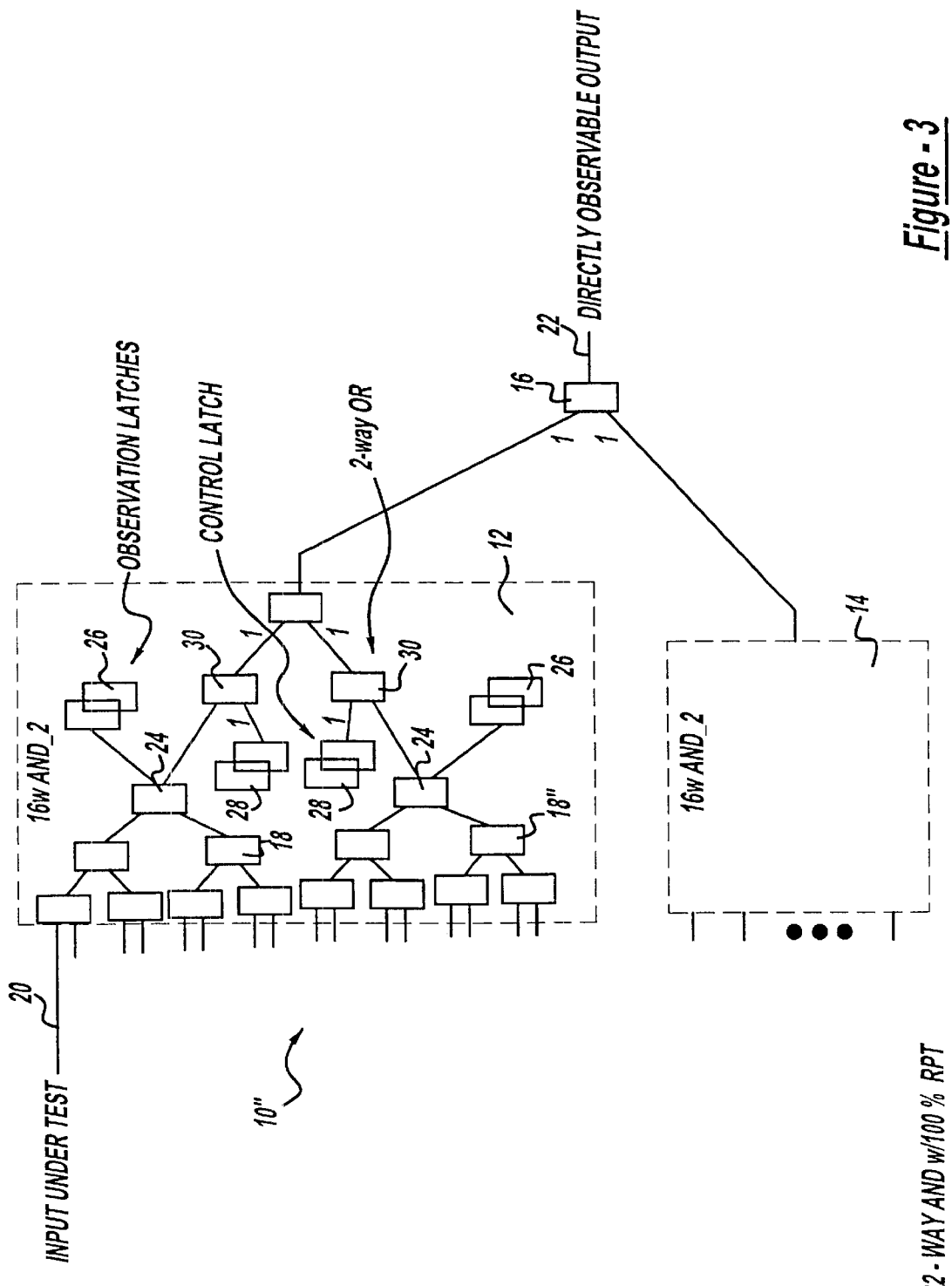
FIG. 3 illustrates a 32-input AND circuit with observation and control test points added which is 100% random pattern testable.

Macro 3 includes the 32-way AND gate 10', shown in FIG. 2, along with a plurality of AND gates 88 and master slave latches 90. The macro 3 also includes a plurality of inputs 92 which are coupled to the outputs 84 of macro 4. Here again, initially when macro 4 is tested individually in the RPT analysis 50, making the appropriate assumptions that all inputs are controllable and all inputs are observable, macro 4 is fully RPT testable. Macro 3 also analyzed individually in the RPT analysis 50 appears to be mostly RPT testable since the 32-way AND circuit 10' is used in this macro 3. However, once these two macros are combined to create a complete netlist, as is done in block 58, macro 4 becomes not RPT testable. The basis for this non-testability is that the outputs 84 of macro 4 are now coupled to a plurality of AND gates 88 which are not 100% testable because of the 32-way AND circuit 10', thereby eliminating the complete observability at output assumption which assumes the outputs are fed directly to storable latches. Thus, when the RPT analysis 60 is run on the entire netlist consisting of macro 3 and 4, the RPT percent coverage 32 becomes zero for macro 4 when it was previously 100%. Because this result may occur late in the design process, it is often times difficult to make changes to correct these problems.

Figure 10A:
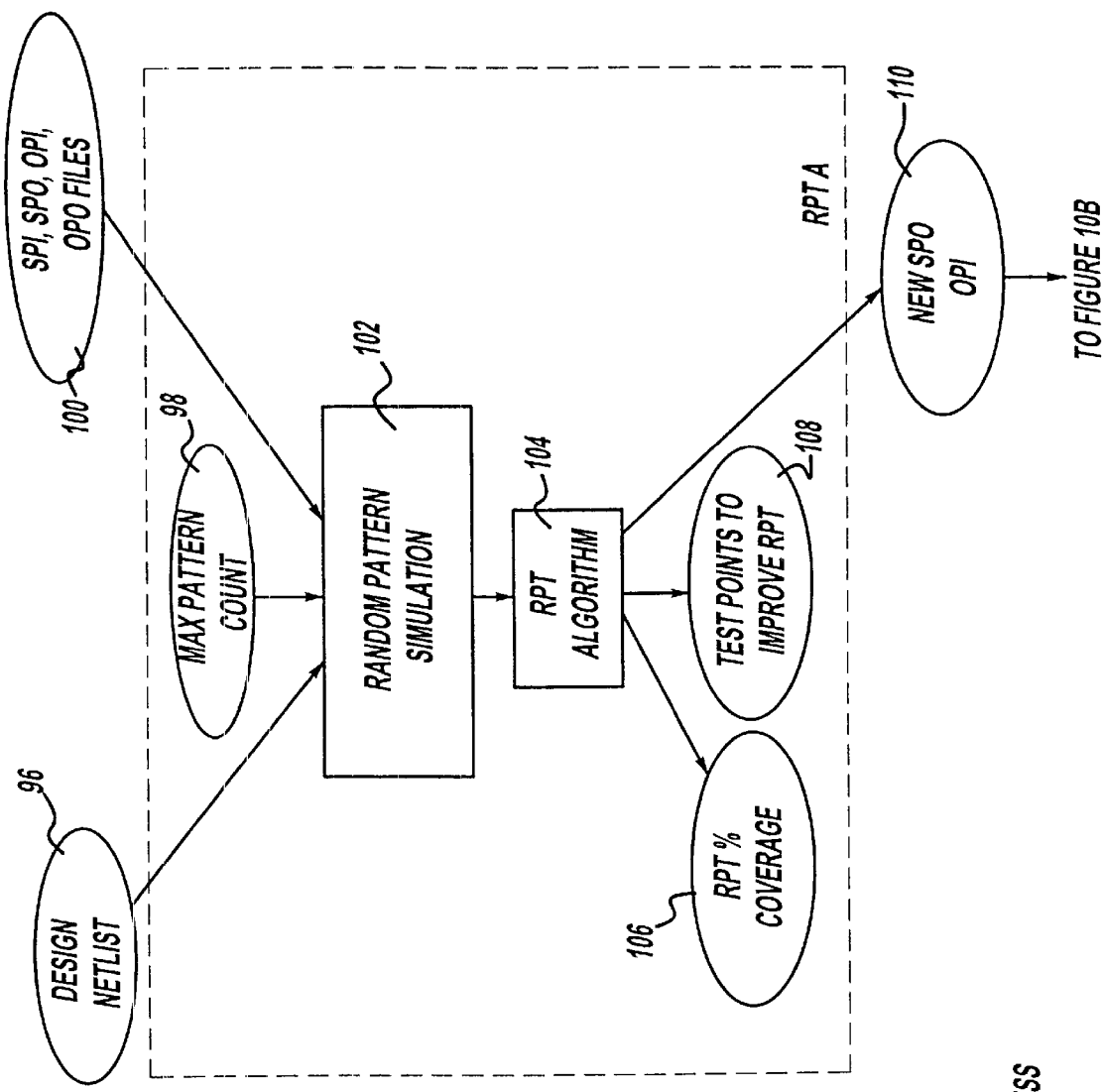
FIGS. 10A–10B is a flow chart describing the random pattern testability (RPT) analysis performed on a single macro according to the teachings of a second preferred embodiment of the present invention.
Figure 10B:
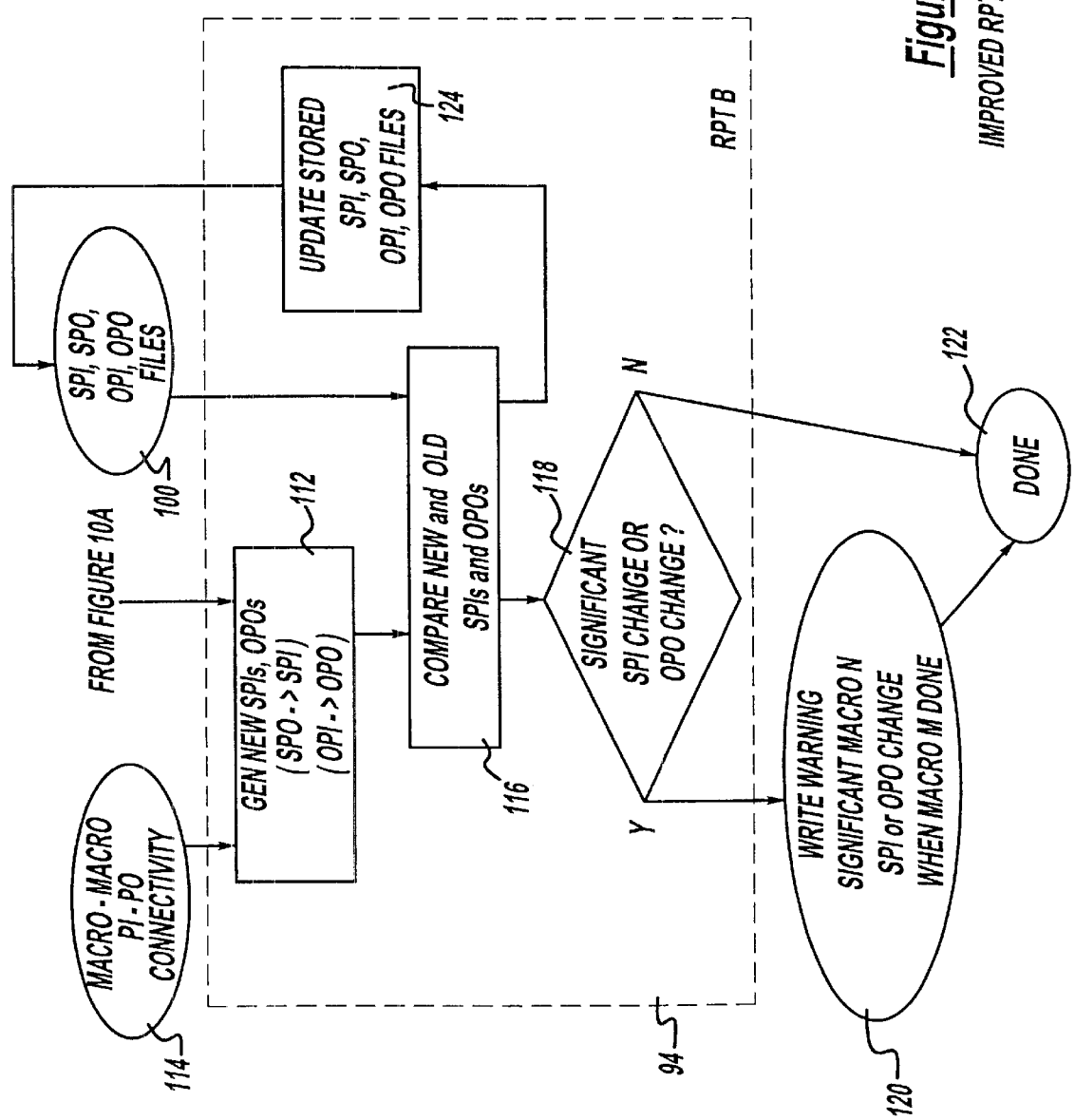

To reduce or eliminate the above-noted problems, an improved RPT process or analysis 94, according to the teachings of the second preferred embodiment of the present invention is shown in FIGS. 10A and 10B. The RPT process 94 improves the accuracy of the RPT calculation of each macro by propagating signal probabilities (probability of a "1"-P(1) and probability of a "0"-P(0)) and observation probabilities (probability of observing when net or output is at logic "0"-B(0) and when net or output is at logic "1"-B(1)) from macro to macro in an iterative manner. Four (4) files are used per macro, SPI (signal probability at input), SPO (signal probability at output), OPI (observation probability at input), and OPO (observation probability at output). These files are a sub-set of the signal probabilities output 46 and consists of input and output signal and observational probabilities for each macro or circuit and not each gate or logic element.

The RPT process 94 begins with three inputs consisting of a design netlist 96, a max pattern count 98 and SPI, SPO, OPI, OPO files 100. Here again, the design netlist 96 is outside the RPT process 94 and is similar to the netlist 52 for a particular macro being tested. Likewise, the max pattern count block 98 is similar to the max pattern count block 36 in the RPT process 32. The SPI, SPO, OPI and OPO information in the input block 100 are also provided to the RPT process 94. All of these input blocks are then forwarded to a random pattern simulation block 102 which is similar to the random pattern simulation block 38, except that it now will use either default probabilities (i.e., P(0)=P(1)=0.5) or actual SPI, SPO, OPI, OPO probabilities previously calculated. An RPT algorithm 104 is then run, which is preferably a Random Resistant Fault Analysis, available from IBM Corporation as an IBM Testbench Tool, further disclosed in detail in Sunil K. Jain and Vishwani D. Agrawal (AT & T Bell Laboratories), "Statistical Fault Analysis," IEEE Design & Test of Computers, Vol 2 No. 2, February 1985, pp. 38–44; S. K. Jain and Vishwani D. Agrawal, "STAFAN: an Alternative to Fault Simulation," ACM/IEEE 21st Design Automation Conference Proceedings, June 1984, pp.18–23; and U.S. Pat. No. 3,761,695, which are each hereby incorporated by reference.

Once the RPT algorithm 104 is performed on the particular macro, RPT percent coverage 106 and test points to improve RPT 108 are determined. New SPO and OPO data is also determined in block 110 based upon any changes in the design netlist 96 or SPI, SPO, OPI, OPO files 100. In other words, when a particular macro is run through the RPT process 94 initially, it may not be coupled to any other macros, in which case the macro will have a particular SPO and OPI probability, supplied by input block 100. However, once additional macros are assembled and tied to the particular macro previously tested and the RPT algorithm 104 run again, the SPO and OPI probabilities may change and are output at this block 110. Accordingly, since the SPI, SPO, OPI, OPO files 100 may change due to coupling of different macros to the particular macro being tested or the design netlist 96 change due to updated design changes in the particular macro being tested, the new SPO and OPO files are generated at block 110.

Referring to FIG. 10B, the new SPO, OPI information from block 110 is fed to a generate new SPIs, OPOs block 112. This block 112 further includes an input from a macro-to-macro PI-PO connectivity input block 114. The macro-to-macro PI-PO connectivity input block 114 identifies the connectivities between macros as the particular circuit is being designed, and is therefore, continuously being updated to provide input and output probability connecting information. In other words, should a first macro first have an RPT algorithm 104 performed and a subsequent macro be added to the chip, the macro-to-macro PI-PO connectivity 114 would take into consideration this additional macro and how this macro affects all other macros on the chip to generate new SPIs and OPOs in block 112.

For example, SPO probabilities are propagated forward from an output of one macro to an input of a connected macro (i.e., SPI). Referring again to FIG. 7, macro 1 individually was assumed easily RPT testable using the assumed signal probability at inputs of 0.5. However, once macro 2 is coupled to macro 1, the output 22 or the signal probability of output (SPO) of macro 2 propagates to the signal probability of the input (SPI) of macro 1, thereby effecting the RPT testability of macro "1." In this regard, the signal probability of input (SPI) of macro 1 would now be the signal probability of the output (SPO) of macro 2 which is not highly RPT testable. For example, should macro 1 first have an RPT algorithm performed on it individually, the default SPI would generally be 0.5. Once macro 2 is connected in the chip, this information is passed from the macro-to-macro PI-PO connectivity block 114 to identify that the output of macro 2 connects to the input of macro 1. Thus, the SPO of macro 2 effects the SPI of macro 1 such that the SPO of macro 2 propagates to the input of macro 2 changing macro 1's SPI to $\frac{1}{2}^{32}$.

Figure 9:
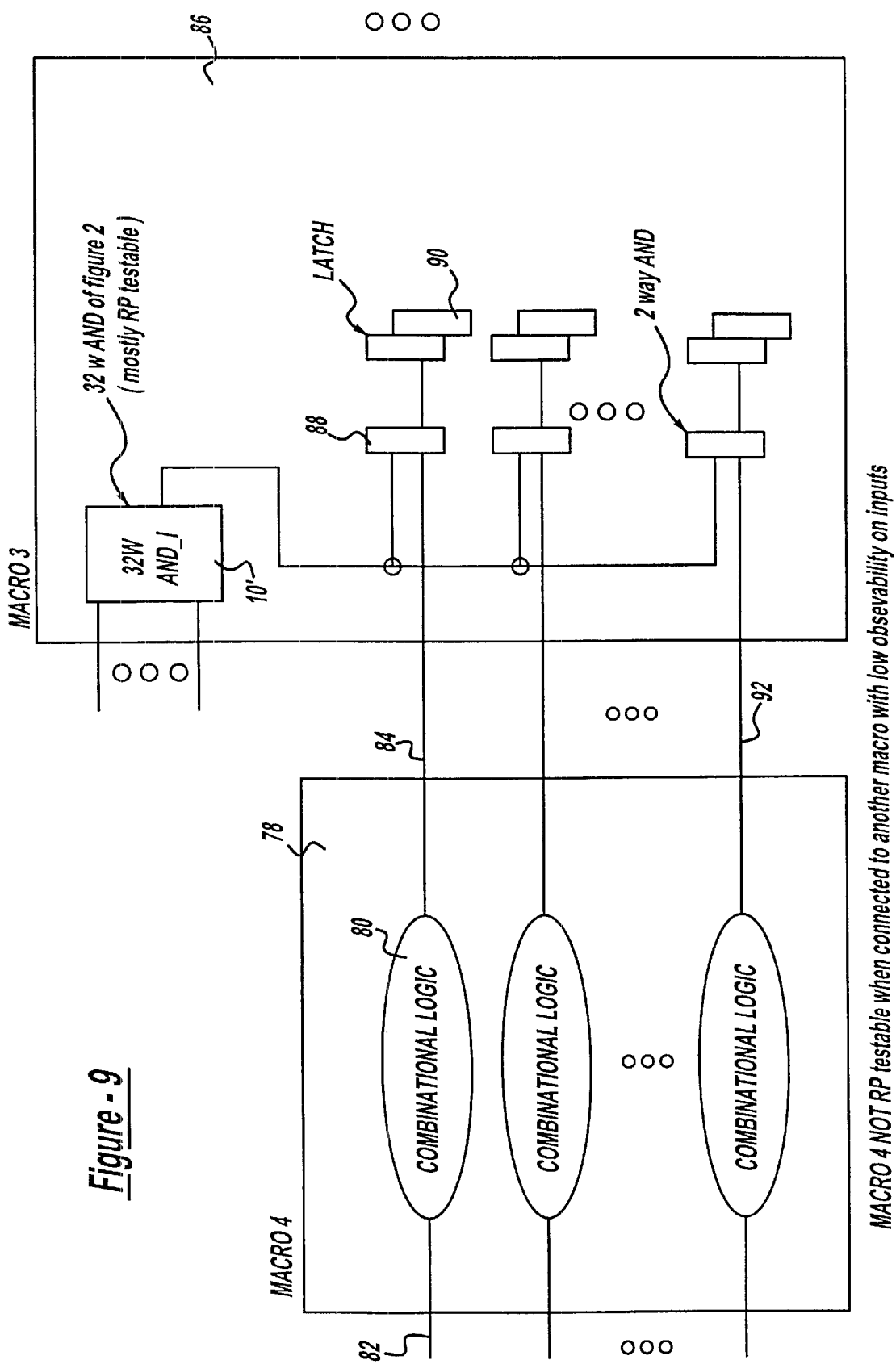
FIG. 9 provides an example of a macro that had high RPT based on macro level analysis, but low RPT at full chip level.

Similar to the signal probabilities, observable probabilities are also affected. Referring to FIG. 9, the RP testability of macro 4 was assumed to be 100% based on the output assumption of 100% observability (OPO=1 for all outputs). Macro 3 is assumed to be highly RP testable even though some internal AND circuits 88 are not testable. Because the ANDs are not testable, the observe probability at input (OPI) for macro inputs connecting to these ANDs equals 0. Since the macro-to-macro connectivity file 114 of FIG. 10B contains information that macro 4 feeds macro 3, the OPI information from macro 3 can be used to update the OPO information of macro 4. This is shown by block 112 of FIG. 10B (OPI>OPO). With this new process, if macro 3 was designed before macro 4, and then RP analysis is done on macro 4, it would be found that macro 4 is untestable because its OPO=0. Accordingly, signal probabilities at output (SPO) propagate forward to signal probabilities of inputs (SPI) of the connecting macro and observable probabilities of input (OPI) propagate backward to previous macros observable probabilities of outputs (OPO).

Once the new SPIs and OPOs are generated in block 112, the SPI and OPO values from block 110 are compared in block 116 with the previous SPI and OPO values from block 100 before the particular connectivity was taken into consideration. The compare new and old SPIs and OPOs block 116 also includes an additional output directed to an update stored SPI, SPO, OPI, OPO file block 124 which updates the files once they are compared. This update information updates the common SPO, SPI, OPO, OPI files block 100.

As previously discussed, macro 1 in FIG. 7 has a default SPI of 0.5 as its old SPI. However, when macro 2 is connected to macro 1, its SPI now changes to $\frac{1}{2}^{32}$. Decision block 118 then determines whether or not this change (i.e., 0.5 to $\frac{1}{2}^{32}$) is a significant change. Decision block 118 identifies a significant change in SPI or OPO when the ratio of the new value to the old value lies outside a specified range which is a user controlled parameter. An exemplary value for this range would be new SPI/old SPI >2 OR new SPI/old SPI<0.5. Based on the above change from 0.5 to $\frac{1}{2}^{32}$, a significant change would be identified by decision block 118 which would then proceed to output block 120 which writes a warning message that a significant macro SPI or OPO change resulted. This warning may then be used by the designer to make appropriate design changes as the circuit is being built or identify that the RPT analysis 94 needs to be run again on that macro. From here the RPT process 94 is completed in the done block 122.

Turning now to FIG. 11, an improved RPT process for a hierarchical design 126 according to the teachings of a third preferred embodiment of the present invention is shown in detail. The RPT process 126 includes common input/output files 128 which are continuously updated and available or accessible as input/output files for all the particular macros being tested. These common input/output files 128 include the SPI, SPO, OPI, OPO input files 100, the macro-to-macro connectivity input files 114 and the warning input block 120. The common input/output files 128 interface and are accessible to each individual parallel RPT process 130 performed on each macro netlist 96 as the circuit is being designed. Each parallel RPT process 130 includes the RPT process 94. The RPT process 94 receives the particular macro netlist 96 information, as well as the information from the common input/output files 128. Should a warning be written from block 120 identifying a significant SPI or an OPO change, a decision block 132 determines whether the particular macro, such as macro 1 is affected by this change.

If it is affected, the RPT process 94 is run again on this particular macro netlist 96 taking into account the changes in the SPI, SPO, OPI, OPO files 100 and the macro-to-macro connectivity 114 files. Upon completing the RPT process 94, the RPT percent coverage 106 and the test points to improve RPT 108 are again reviewed to determine if any changes are needed to macro 1 in a changes needed decision block 134. Should changes be needed, the macro 1 netlist 96 is updated to incorporate these changes and the RPT process 94 again run. Should no changes be needed, the parallel RPT process 130 moves to decision block 136 to determine if all macro designs or netlists 96 have been tested and completed. If so, the RPT process for hierarchical design 126 is completed at block 138, if not, additional macros netlists 96 in the circuit are tested until all macro testing and design is complete.

This improved RPT process for hierarchical design 126 enables RPT analysis to be performed on each macro as each macro is individually added to the entire chip circuit. This RPT process 126 also takes into consideration the connectivity as the macros are coupled to each other based upon the common input/output files 128. In this regard, by each macro continuously receiving inputs from the macro-to-macro connectivity file 114, the SPI, SPO, OPI, OPO files 100 and the warning 120 files, each particular macro may run RPT analysis 130 only once or on several occasions depending on its connectivity with other macros in the circuit and design changes performed on the circuits which affect the RPT process 130.

In summary, the RPT process for hierarchical design 126 essentially includes the following steps. First, all macros (1 to n) are run separately through existing parallel RPT processes (e.g. Random Resistant Fault Analysis, an IBM TestBench tool) 130. It is required that the RPT algorithm 104 in the process 130 read the SPI and OPO files 100. The SPI file has input signal probabilities in the form INPUT_NAME P(1) P(0). The OPO file has output observation probabilities in the form OUTPUT_NAME B(1) B(0). For the first iteration, all inputs have P(1)=P(0)=0.5 and all outputs have B(1)=B(0)=1.0. SPO and OPI files 110 are generated for each macro (1 to n) with calculated macro output signal probabilities in the form OUTPUT_NAME P(1) P(0) and input observation probabilities in the form INPUT_NAME B(1) B(0).

Second, the existing macro-to-macro connectivity file 114 in the form MACRO1_NAME OUTPUT_NAME MACRO2_NAME INPUT_NAME, etc. is used to update all SPI records with calculated output probabilities from the macro that feeds the inputs in block 112. All OPO records are also updated with calculated observation probabilities from the macros fed by the outputs in block 112. If there is incomplete information (a missing connection, invalid data, etc.), a warning message is issued and a default signal probability is used. Block 112 thus propagates calculated signal output probabilities to the macro inputs they feed.

Step 1 is repeated using the updated SPI and OPO files 100, where input probabilities are no longer assumed but are determined by the output probabilities they are connected to. The SPI information directs the random pattern simulator 102 to put "1" and "0" values on that input or latch at the specified probability. New SPO and OPI files are generated again at block 110.

The new SPI values are compared with the old SPI values at block 116. When the ratio of the new value to the old value lies outside a specified range, a warning message is written by the program at block 120 that indicates to the logic designer that a significant change 118 in input signal probability assumptions has occurred on a certain macro and that RPT needs to be redone. That range is a user controlled parameter. An exemplary value would be new SPI/old SPI>2 OR new SPI/old SPI<0.5.

The new OPO values are also compared with the old OPO values at block 116. When the ratio (new OPO./old OPO) is less than a desired value, a warning message 120 is written as above stating that output observability values on a certain macro have significantly changed and that RPT needs to be redone. An exemplary value would be 0.1, but this parameter is also user controllable.

Referring again to macro 1 and macro 2, as shown in FIG. 7, and the above summary, the RPT process of hierarchical design 94 operates as follows. The implementation of macro 2 is assumed to be the highly RP testable version of FIG. 2. It is assumed that only one net or output 22 from macro 2 feeds macro 1 and no nets or outputs 76 from macro 1 feed macro 2. It is also assumed for simplicity that no other inputs of macro 1 significantly affect RP testability, even when connections to other macros are considered. SPI and SPO values are the probability of a "1" on the net connecting macro 2 to macro 1. In this particular example, SPI refers to the input of macro 1 and SPO refers to the output of macro 2. In this case, macro 2 goes through macro level RPT 130 first, and then some time later macro 1 goes through RPT 130. OPO and OPI values are left out for simplicity. The results are:

| PASS | MACRO | % RPT | TEST POINTS | SPI | SPO |
|---|---|---|---|---|---|
| 1 | 1 | 95 | none | 0.5 (default) | — |
| 1 | 2 | 96 | none | — | $1/2^{32}$ |

After this first pass, the macro-to-macro connectivity file 114 identifies that the SPO value needs to be propagated to the SPI value in block 112. A warning is then raised to the designer indicating that a severe probability change occurred and that macro 2 needs to have RPT redone via blocks 118, 120 and 132. When macro 2 goes through RPT 130 a second time, the new SPI from file 100 is used. Because of the nature of macro 2, its testability is highly dependent on the input probability of that net. The next pass of RPT 130 on macro 2 would look like this: PASS MACRO %RPT TEST POINTS SPI SPO 2 2 20 control 1, input 1 $½^{32}$ This second pass indicates using existing tools that testability can be improved by a control point on input 1 (the input driven from macro 2) that forces that input to 1. Note that a major RPT improvement could be made on this macro without using a full chip model. In fact, only macro 1 and macro 2 need to be done.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention.

What is claimed is:

1. A method to improve random pattern testability (RPT) of a hierarchical semiconductor chip design formed from a plurality of macros, each macro identifying a particular portion of the semiconductor chip design, said method comprising:

providing a first macro netlist identifying a logical description of a first portion of the semiconductor chip design;

performing a RPT analysis on the first macro netlist;

providing a second macro netlist identifying a logical description of a second portion of the semiconductor chip design;

performing a RPT analysis on the second macro netlist;

combining the first macro netlist with the second macro netlist; and performing a RPT analysis on the combination of the first and second-macro netlists.

2. The method as defined in claim 1 further comprising determining if a change is needed in the first macro netlist after performing the RPT analysis on the first macro netlist.

3. The method as defined in claim 2 further comprising updating the first macro netlist based upon the RPT analysis on the first macro netlist and performing a RPT analysis on the updated first macro netlist.

4. The method as defined in claim 1 wherein combining the first macro netlist with the second macro netlist forms a full chip model of the semiconductor chip design.

5. The method as defined in claim 1 further comprising determining if any changes are needed in the first macro netlist and the second macro netlist after performing the RPT analysis on the combined first and second macro netlists.

6. The method as defined in claim 1 wherein each RPT analysis identifies RPT percent coverage information and test points to improve RPT percent coverage for the macro netlist analyzed.

7. A method to improve random pattern testability (RPT) of a hierarchical semiconductor chip design formed from a plurality of macros, each macro identifying a particular portion of the semiconductor chip design, said method comprising:

providing a common input/output file accessible by each macro;

providing a first macro netlist identifying a logical description of a first portion of the semiconductor chip design;

performing a RPT analysis on the first macro netlist;

updating the common input/output file based upon the RPT analysis on the first macro netlist;

providing a second macro netlist identifying a logical description of a second portion of the semiconductor chip design;

performing a RPT analysis on the second macro netlist;

updating the common input/output file based upon the RPT analysis on the second macro netlist; and determining if an RPT analysis needs to be performed on the first macro netlist based upon the updated common input/output file.

8. The method as defined in claim 7 wherein the common input/output file includes macro-to-macro connectivity input file data identifying connectivities between the plurality of macros.

9. The method as defined in claim 8 wherein the common input/output file further includes a signal probability at input (SPIY, a signal probability at output (SPO), an observation probability at input (OPI) and an observation probability at output (OPO) file.

10. The method as defined in claim 9 wherein the common input/output file further includes a warning file identifying a significant change in at least one of an SPI or an OPO file.

11. The method as defined in claim 7 further comprising determining if a change is needed in the first macro netlist after performing the RPT analysis on the first macro netlist.

12. The method as defined in claim 11 further comprising updating the first macro netlist based upon the RPT analysis on the first macro netlist and performing a RPT analysis on the updated first macro netlist.

13. The method as defined in claim 7 wherein each RPT analysis identifies RPT percent coverage information and test points to improve RPT percent coverage for the macro netlist analyzed.

14. The method as defined in claim 7 further comprising determining if all macro netlists have completed RPT analysis.

* * * * *

UNITED STATES PATENT AND TRADEMARK OFFICE
CERTIFICATE OF CORRECTION

PATENT NO.    : 6,532,571 B1
DATED         : March 11, 2003
INVENTOR(S)   : Gabrielson et al.

It is certified that error appears in the above-identified patent and that said Letters Patent is hereby corrected as shown below:

Column 11,
Line 66, delete "PASS MACRO %RPT TEST POINTS SPI SPO 2 2 20 control 1, input 1 $½^{32}$"
and insert the following table:
-- PASS MACRO %RPT   TEST POINTS    SPI   SPO
      2       2        20    control 1, input 1   $½^{32}$ --

Column 13,
Line 20, delete "(SPIY" and insert -- (SPI) --

Signed and Sealed this

Nineteenth Day of August, 2003

JAMES E. ROGAN
*Director of the United States Patent and Trademark Office*